(12) United States Patent
Maloberti et al.

(10) Patent No.: US 7,126,415 B2
(45) Date of Patent: Oct. 24, 2006

(54) SWITCHED-CAPACITOR CIRCUITS WITH REDUCED FINITE-GAIN EFFECT

(75) Inventors: Franco Maloberti, Plano, TX (US); Martin K. Kinyua, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/287,411

(22) Filed: Nov. 23, 2005

(65) Prior Publication Data

US 2006/0071709 A1    Apr. 6, 2006

Related U.S. Application Data

(62) Division of application No. 10/750,508, filed on Dec. 31, 2003, now Pat. No. 7,068,203.

(51) Int. Cl.
*H03F 1/02* (2006.01)
(52) U.S. Cl. .............................. 330/9; 330/51; 330/109
(58) Field of Classification Search .................... 330/9, 330/51, 109
See application file for complete search history.

(56) References Cited

U.S. PATENT DOCUMENTS

| 4,429,282 | A | * | 1/1984 | Saari | 330/9 |
| 4,714,843 | A | * | 12/1987 | Smith | 327/91 |
| 5,479,130 | A | * | 12/1995 | McCartney | 327/341 |
| 6,037,836 | A | * | 3/2000 | Yoshizawa | 330/9 |
| 6,191,648 | B1 | * | 2/2001 | Lewicki | 327/554 |
| 6,441,769 | B1 | | 8/2002 | Nagaraj | |
| 6,573,785 | B1 | * | 6/2003 | Callicotte et al. | 330/9 |
| 6,606,042 | B1 | | 8/2003 | Sonkusale et al. | |

OTHER PUBLICATIONS

Temes, "Finite Amplifier Gain and Bandwidth Effects in Switched-Capacitor Filters", J. Sol. State Circ., vol. SC 15, No. 3 (IEEE, Jun. 1980), pp. 358-361.
Martin, et al., "Effects of the Op Amp Finite Gain and Bandwidth on the Performance of Switched-Capacitor Filters", Trans. Circ. Sys., vol. CAS-28, No. 8 (IEEE, 1981), pp. 822-829.
Nagaraj, et al., "Reduction of Finite-Gain Effect in Switched-Capacitor Filters", Elec. Lett., vol. 21, No. 15 (Jul. 18, 1985), pp. 644-645.
Nagaraj, et al., "Switched-Capacitor Circuits with Reduced Sensitivity to Amplifier Gain", Trans. Circ. Sys., vol. CAS-24, No. 5 (IEEE, 1987), pp. 571-574.
"Understanding Pipelined ADCs", Application Note 383 (Dallas Semiconduictor, Mar. 1, 2001).

* cited by examiner

*Primary Examiner*—Patricia Nguyen
(74) *Attorney, Agent, or Firm*—W. James Brady, III; Frederick J. Telecky, Jr.

(57) ABSTRACT

Operational amplifier circuits (20, 30) including error capacitors ($C_3$, C13) for storing finite gain effect error voltages for correction of output voltages of the circuits (20, 30), are disclosed. The circuits (20, 30) are operated in a sample clock phase to produce an approximation of the output voltage, using negative polarity versions of the input voltages to the circuit. The approximate output voltage is used to produce and store an error voltage, corresponding to the differential voltage at the input of the operational amplifier (15, 25), relative to virtual ground. This error voltage is then subtracted from the input voltage applied in the operate clock phase, to correct for the finite gain effect. A pipelined analog-to-digital converter (50) using the disclosed operational amplifier circuits (20, 30) is also disclosed.

8 Claims, 9 Drawing Sheets

SWITCHED-CAPACITOR CIRCUITS WITH REDUCED FINITE-GAIN EFFECT

CROSS-REFERENCE TO RELATED APPLICATIONS

This application claims priority under 35 USC § 120 of application Ser. No. 10/750,508, filed Dec. 31, 2003 now U.S. Pat. No. 7,068,203. This application is a divisional of the above mentioned application.

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuits, and is more specifically directed to analog switched-capacitor circuits utilizing operational amplifiers.

A common building block in modern analog or mixed-signal analog electronic circuits is the operational amplifier. As is fundamental in the art, operational amplifiers can be readily implemented into analog circuits for performing a wide range of functions, including analog multiplication, analog integration, active filtering, and analog-to-digital conversion, to name a few. These widely ranging functions derive from the ideal characteristics of an operational amplifier (or "op amp"), namely infinite open loop gain, infinite input impedance, and zero output impedance. These ideal characteristics are used to advantage in conventional feedback op amp implementations, resulting in a "virtual" ground at the input (for finite voltage at the output, with infinite gain), and in the capability of the ideal op amp to generate high output current from zero input current.

An important class of circuits that are based on op amp realizations are switched-capacitor circuits. In general, switched-capacitor circuits involve the switching of charge among capacitors, for example from an input capacitor to a downstream capacitor or capacitor network or to an op amp input. Switched-capacitor circuits use the transfer of charge among capacitors rather than the switching of current through resistors, to accomplish the circuit functions. Switched capacitor circuits are particularly attractive in modern integrated circuits, because of the ability of the manufacturing technology to physically construct high-quality capacitors in relatively small integrated circuit "chip" area; in contrast, integrated circuit resistors tend to occupy a great deal of chip area, and are difficult to fabricate with precise resistance values.

FIG. 1 illustrates a first example of a conventional op amp circuit, specifically a sample-and-hold circuit. The function of this circuit is to drive an output voltage $V_{out}$ that corresponds to a sample of an input voltage $V_{in}$. In this circuit, op amp 2 has its non-inverting input biased to ground and its inverting input connected to one plate of capacitor C at a node that is connected to ground through pass switch SB. The other plate of capacitor C is connected to receive input voltage $V_{in}$ through pass switch SA, and the output of op amp 2 through pass switch SC. Pass switches SA, SB are clocked to be closed during clock phase $\Phi_1$, while pass switch SC is clocked to be closed during clock phase $\Phi_2$. Clock phases $\Phi_1$, $\Phi_2$ are non-overlapping clock phases, as shown in FIG. 1.

In operation, during "sample" clock phase $\Phi_1$, input voltage $V_{in}$ charges capacitor C through closed pass switch SA, with pass switch SB connected to ground. During "hold" clock phase $\Phi_2$, pass switches SA, SB open, and pass switch SC closes. Because the non-inverting input of op amp 2 is at virtual ground for a finite output voltage $V_{out}$, and because pass switch SC has now connected capacitor C into the feedback loop, output voltage $V_{out}$ equals the input voltage $V_{in}$, (because of the inverting by op amp 2). Op amp 2 maintains this output voltage $V_{out}$ until the next sample and hold period.

FIG. 2 illustrates another conventional op amp circuit, which in this case is a switched-capacitor residual gain generator as used in a pipelined multiplying-digital-to-analog converter (MDAC) circuit. The function of the circuit of FIG. 2 is to derive an output signal $V_{out}$ that depends upon the difference (i.e., residual) between an input voltage $V_{in}$ and a reference voltage $V_{DAC}$. In this example in which the pipeline has 1 bit or 1.5 bits per stage, the output voltage $V_{out}$ is intended to be twice the difference between input voltage $V_{in}$ and a reference voltage $V_{DAC}/2$, where voltage $V_{DAC}$ is the unipolar full scale voltage of the pipelined MDAC. In this circuit, pass switches S1, S2 each receive input voltage $V_{in}$ on one side, and are connected to another side to a first plate of respective capacitors $C_A$, $C_B$. Capacitors $C_A$, $C_B$ are preferably of the same capacitance value. The other plates of capacitors $C_A$, $C_B$ are connected together, and to an inverting input of op amp 4 via pass switch S5; these capacitor plates are also connected to ground via pass switch S6. The first plate of capacitor $C_A$ is connected to receive reference voltage $V_{DAC}$ via pass switch S3, while the first plate of the capacitor $C_B$ is connected to the output of op amp 4 via pass switch S4. Pass switches S1, S2, and S6 are clocked to be closed during clock phase $\Phi_1$, while pass switches S3, S4, and S5 are clocked to be closed during clock phase $\Phi_2$. Clock phases $\Phi_1$, $\Phi_2$ are non-overlapping clock phases, as shown in FIG. 1.

In operation during "sample" clock phase $\Phi_1$, pass switches S1, S2, and S6 are closed, and pass switches S3, S4, S5 are open. Pass switches S1, S2 connect the input voltage $V_{in}$ to capacitors $C_A$, $C_B$; the opposite plates of capacitors $C_A$, $C_B$ are connected to ground by the closed state of switch S6. Capacitors $C_A$, $C_B$ thus both charge to input voltage $V_{in}$ during this clock phase. In clock phase $\Phi_2$, pass switches S1, S2, and S6 are open, and pass switches S3, S4, and S5 are closed. During this clock phase, the capacitor $C_B$ becomes the feedback capacitor, and capacitor $C_A$ receives the reference voltage $V_{DAC}$. To the extent that reference voltage $V_{DAC}$ differs from input voltage $V_{in}$, charge sharing between capacitors $C_A$ and $C_B$ occurs. One can analyze the circuit by equating the sum of the charge on capacitors $C_A$ and $C_B$ during clock phase $\Phi_1$ with the sum of the charge on these capacitors during the next clock phase $\Phi_2$. In other words:

$$-V_{in}C_A - V_{in}C_B = -V_{out}C_B - V_{DAC}C_A \qquad (1)$$

where the positive polarity sign of the charge on capacitors $C_A$, $C_B$ points toward the inverting input of op amp 4, at virtual ground. Solving for output voltage $V_{out}$, and assuming identical capacitance C for capacitors $C_A$ and $C_B$:

$$V_{out} = 2\left(V_{in} - \frac{V_{DAC}}{2}\right) \quad (2)$$

In this manner, the circuit of FIG. 2 generates an output that depends on a difference input signal. This residual gain stage is especially useful in multiplying DAC circuits, as known in the art.

Modern circuit design concepts and manufacturing technology have enabled the construction of conventional op amps that approach these ideal characteristics, with very high gains, very high input impedance, and very low output impedance. To the extent that the actual realization of modern op amps fall short of the ideal characteristics, however, error is introduced into the circuit. For example, the necessarily finite gain of the op amp is typically reflected by a voltage at the op amp input that is not at ground, but is instead at a voltage inversely proportional to the finite gain. This defeats the "virtual" ground assumption for the ideal op amp, and thus introduces error into the circuit. This source of error is typically referred to in the art as the "finite gain effect".

In addition, the switching speed of conventional op amps is also not instantaneous, which also introduces error into the circuit.

It is well known in the art that conventional op amp designs involve a tradeoff between switching speed and gain, such that a high switching speed can only be attained by sacrificing op amp gain, and vice versa. Highly precise analog circuits, such as multiplying DACs, thus involve this tradeoff between precision (typically reflected in the number of bits of precision in the conversion) and switching speed.

Because of these effects, the circuit application must either tolerate non-ideal op amp characteristics, or circuit techniques must be developed to reduce the effect of these non-ideal characteristics. Previous circuit approaches to the reduction of finite gain effects are known in the art.

Nagaraj et al., "Reduction of the finite-gain effect in switched-capacitor filters", *Electron. Lett.*, Vol. 21 (July 1985), pp. 644–645; and Nagaraj et al., "Switched-Capacitor Circuits with Reduced Sensitivity to Amplifier Gain", *IEEE Transactions on Circuits and Systems*, Vol. CAS-34, No. 5 (May 1987), disclose examples of these previous circuit approaches for reducing the finite gain effect. In these circuits, a correction for the finite gain effect is derived in a first, sample, clock phase, and then applied to the op amp in the second clock phase. These approaches each rely on the input voltage being stable over both clock phases of operation. If the input voltage changes between phases, however, the correction is not accurate without including a third clock phase to obtain the exact correction. Accordingly, it is believed that the performance of these known op amp circuits is limited.

BRIEF SUMMARY OF THE INVENTION

It is therefore an object of this invention to provide a switched-capacitor operational amplifier circuit in which the finite gain effect is minimized.

It is a further object of this invention to provide such a circuit in which modest op amp gain values can still provide excellent precision operation.

It is a further object of this invention to relax the tradeoff between op amp gain and switching speed, such that a higher speed op amp can be used in a precise application, such as a pipelined analog-to-digital converter (ADC).

It is a further object of this invention to provide such a circuit that can be implemented as a sample-and-hold circuit, as a residual gain stage, and other op amp based circuits.

It is a further object of this invention to provide a pipelined ADC utilizing such a circuit, in which the clock phase timing of the pipelined stages is arranged to feed the correction values ahead to downstream stages, optimizing the performance of the circuit.

Other objects and advantages of this invention will be apparent to those of ordinary skill in the art having reference to the following specification together with its drawings.

The present invention may be implemented into a switched-capacitor circuit utilizing an operational amplifier ("op amp"), by including an additional capacitor coupled to an input of a fully differential op amp. Pass switches in the circuit are configured so that, during a first, sample, clock phase, a voltage corresponding to the differential at the op amp input from virtual ground is stored across the additional capacitor. In the succeeding amplify clock phase, this differential voltage is effectively subtracted from the voltage appearing at the op amp input, compensating for the op amp finite gain. This implementation can be used in a sample-and-hold circuit, or in a residual gain generator circuit such as used in multiplying digital-to-analog converter (MDAC) stages.

According to another aspect of the invention, a pipelined ADC is constructed using the inventive op amp circuits. Estimates of the op amp circuit outputs are fed ahead to the next stages of the pipeline, and the clock phase timing of the pipelined stages is arranged to accept the estimates, enabling high performance operation.

DETAILED DESCRIPTION OF THE INVENTION

The present invention will be described in connection with its preferred embodiment, namely as implemented into various circuits used in a pipelined analog-to-digital converter (ADC). This particular implementation is described because it is contemplated that this invention is especially beneficial in such an application. However, it is also contemplated that this invention can be advantageously used in a wide range of operational amplifier circuits. Accordingly, it is to be understood that the following description is provided by way of example only, and is not intended to limit the true scope of this invention as claimed.

Figure 3:
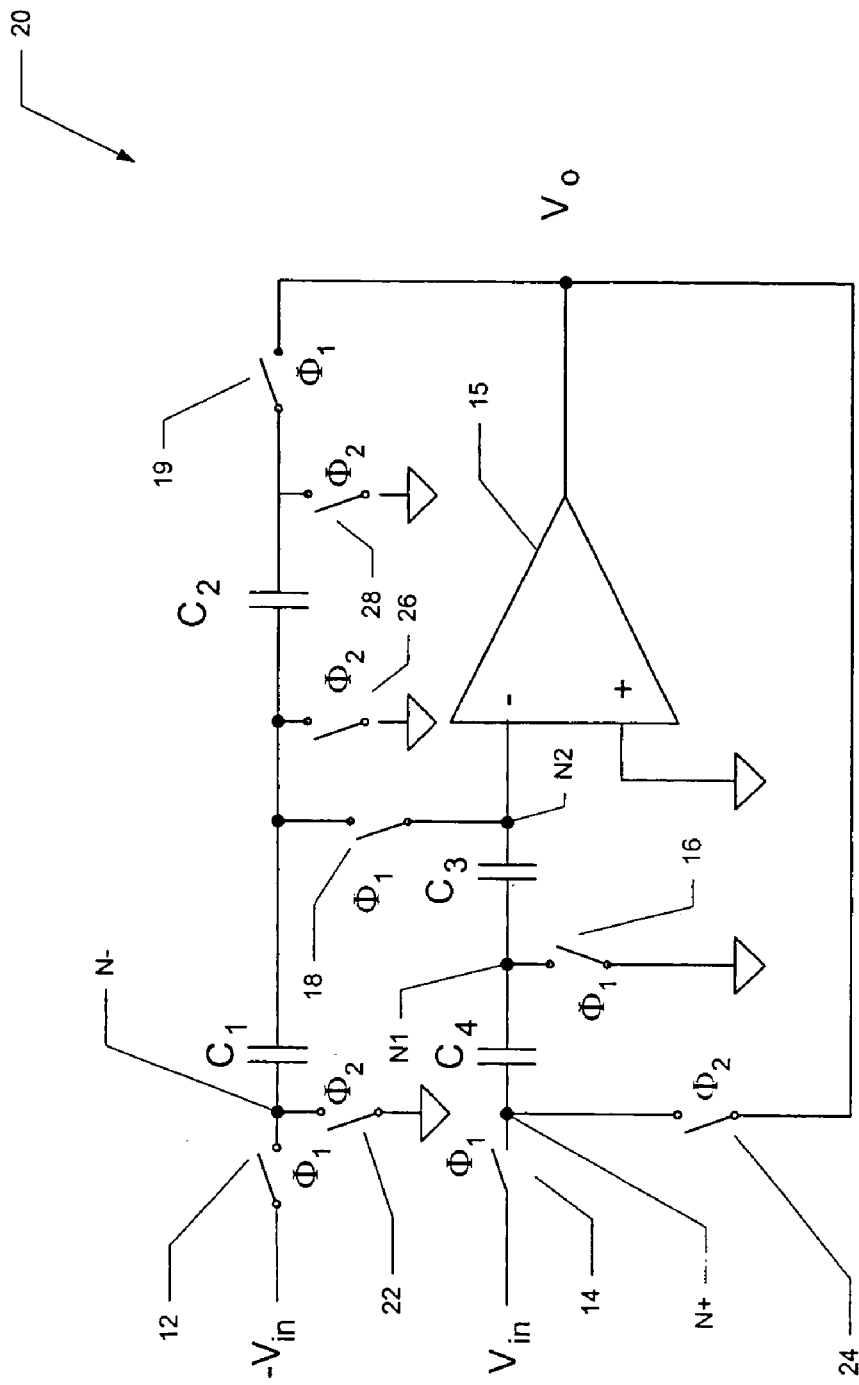
FIG. 3 is an electrical diagram, in schematic form, of a sample-and-hold circuit constructed according to the preferred embodiment of the invention.

Referring now to FIG. 3, sample-and-hold circuit 20 constructed according to a preferred embodiment of the invention will now be described. As shown in FIG. 3, sample-and-hold circuit 20 includes operational amplifier ("op amp") 15, which has its non-inverting input at ground, and its inverting input connected to a node N2 connected to one side of capacitor $C_3$ and one side of pass switch 18. Circuit 20 according to this embodiment of the invention is single-ended, but in its practical implementation would be fully differential in order to receive input voltage $V_{in}$ and its negative $-V_{in}$; the output of circuit 20 is output voltage $V_o$, driven by the output of op amp 15. The positive input voltage $V_{in}$, is received by capacitor $C_4$ at node N+ through pass switch 14; an opposite plate of capacitor $C_4$ is connected to node N1, as is capacitor $C_3$. Node N1 is selectably connected to ground through pass switch 16. A feedback loop is formed by pass switch 24, which connects node N+ to the output of op amp 15.

The negative input voltage $-V_{in}$, is received by capacitor $C_1$, at node N−, via pass switch 12. Node N− is selectably connected to ground through pass switch 22. Capacitor $C_1$ is also connected to capacitor $C_2$, and to node N2 via pass switch 18. Capacitor $C_2$ is connected to the output of op amp 15 via pass switch 19, and both sides of capacitor $C_2$ can be grounded by pass switches 26, 28.

Pass switches 12, 14, 16, 18, 19, 22, 24, 26, 28 are constructed by transistors, according to the available technology used to realize the integrated circuit including sample-and-hold circuit 20. For example, if complementary metal-oxide-semiconductor (CMOS) technology is available, each of pass switches 12, 14, 16, 18, 19, 22, 24, 26, 28 may be constructed by the conventional arrangement of parallel-connected p-channel and n-channel transistors, with the gates of these transistors receiving complementary control signals. In circuit 20 according to this embodiment of the invention, pass switches 12, 14, 16, 18, 19 are controlled to be closed during clock phase $\Phi_1$ (and open otherwise) while pass switches 22, 24, 26, 28 are controlled to be closed during clock phase $\Phi_2$ (and open otherwise). Clock phases $\Phi_1$ and $\Phi_2$ are non-overlapping clock signals, as conventional in the art for switched-capacitor circuits, as mentioned above.

Capacitors $C_1$ through $C_4$ are conventional capacitor devices, also constructed according to the available technology used to realize the integrated circuit including sample-and-hold circuit 20. For example, it is contemplated that capacitors $C_1$ through $C_4$ will be conventional MOS capacitors. The particular capacitance values will depend upon the specific circuit design; for ease of explanation, this description will assume that capacitors $C_1$ through $C_4$ will all have the same capacitance value as one another.

Figures 4A, 4B:
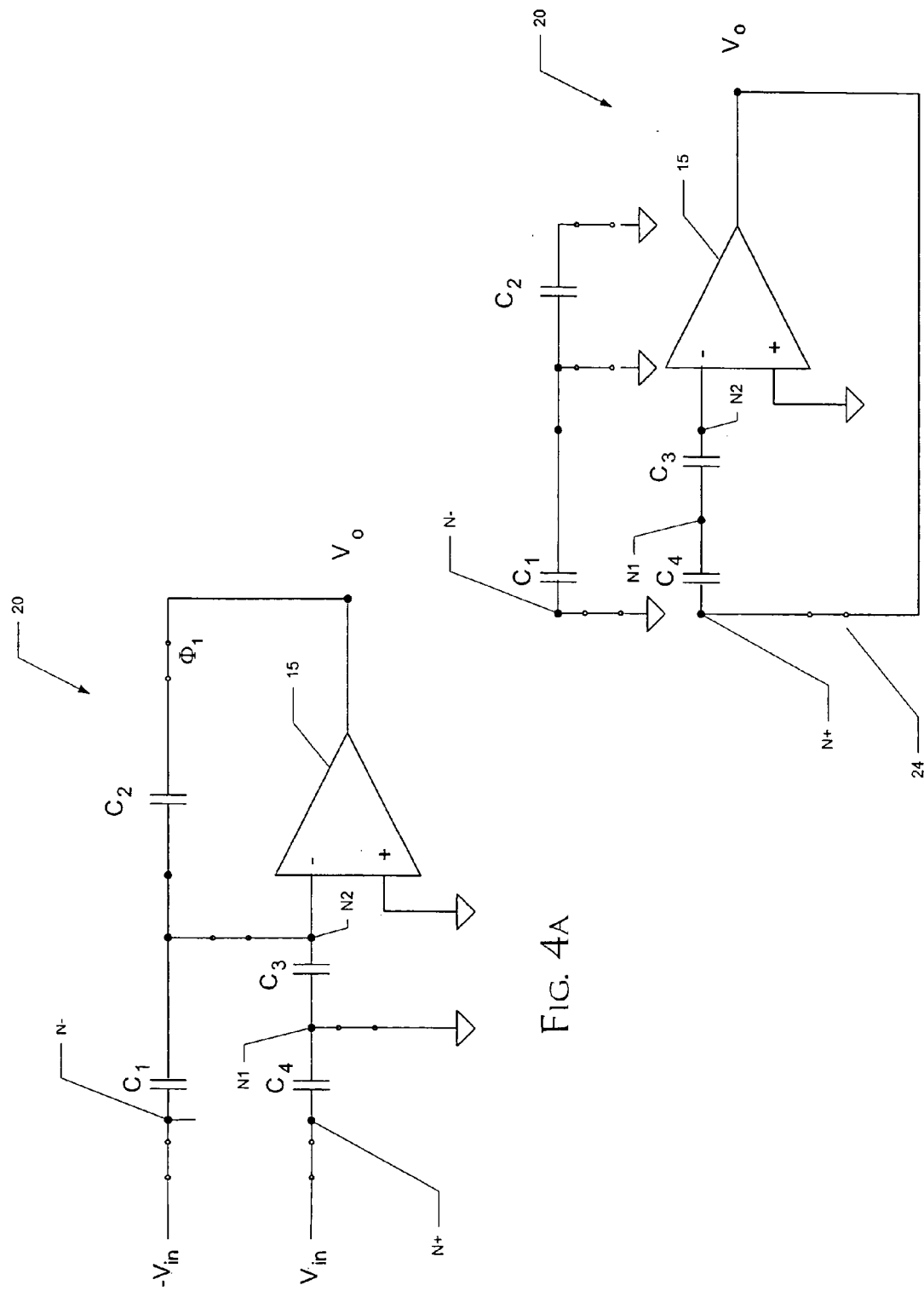
FIGS. 4a and 4b are electrical diagrams, in schematic form, of the sample-and-hold circuit of FIG. 3, according to the preferred embodiment of the invention, in first and second clock phases, respectively.

In operation, sample-and-hold circuit 20 uses clock phase $\Phi_1$ as a "sample" phase, and clock phase $\Phi_2$ as a "hold" phase. FIG. 4a illustrates circuit 20 during clock phase $\Phi_1$, in which pass switches 12, 14, 16, 18, 19 (not shown) are closed and pass switches 22, 24, 26, 28 (not shown) are open. In this clock phase, input voltages $V_{in}$, $-V_{in}$ are stored across capacitors $C_4$, $C_1$, respectively. Because of the feedback connection of capacitor $C_2$ (assuming that it has the same capacitance as capacitor $C_1$), the output voltage $V_o$ closely resembles input voltage $V_{in}$ because of the application of negative input voltage $-V_{in}$ to the inverting input of op amp 15. Capacitor $C_1$ stores voltage $V_{in}$ during this sample clock phase $\Phi_1$, in the conventional manner for sample-and-hold circuits.

Ideally, in clock phase $\Phi_1$, node N2 at the inverting input to op amp 15 is at virtual ground, due to the infinite gain of op amp 15. Of course, in practice, the gain of op amp 15 is not infinite but is instead a finite gain $A_0$, and as such the voltage at node N2 in clock phase $\Phi_1$ is not at ground (but is instead at a voltage $V_o/A_0$). According to this preferred embodiment of the invention, this voltage $V_o/A_0$ at node N2 is stored across capacitor $C_3$, since node N1 is at ground.

The state of sample-and-hold circuit 20 at clock phase $\Phi_2$ is shown in FIG. 4b, in which pass switches 22, 24, 26, 28 (not shown) are closed and pass switches 12, 14, 16, 18, 19 (not shown) are open. During this clock phase $\Phi_2$, capacitors $C_1$ and $C_2$ are discharged to ground. The input voltage $V_{in}$ that was stored across capacitor $C_4$ is applied to the non-inverting input of op amp 15 (as a negative voltage, since node N1 was previously grounded). However, capacitor $C_3$ is in series with capacitor $C_4$ and, as discussed above, is storing voltage $V_o/A_0$ from clock phase $\Phi_1$. This voltage $V_o/A_0$ is opposite in polarity from the stored input voltage $V_{in}$, and as such is effectively subtracted from sampled input voltage $V_{in}$. In effect, the non-zero voltage $V_o/A_0$ due to the finite gain of op amp 15 is applied as a correction to the input of op amp 15 in the hold phase, thus compensating for the finite gain effect of non-ideal op amp 15.

The correction applied by sample-and-hold circuit 20 resulting from the finite gain effect is especially accurate, relative to known prior techniques, because the correction voltage $V_o/A_0$ is derived from the same voltage that is then being sampled in the sample clock phase $\Phi_1$. According to this embodiment of the invention, this correction voltage is derived from the complement to the input voltage $V_{in}$ being sampled, in this fully differential implementation.

The effect of the finite gain effect correction provided by sample-and-hold circuit 20 according to this embodiment of the invention is to reduce the circuit error to a level that would be available from an op amp having much higher gain than op amp 15 actually has. In other words, from a precision standpoint, sample-and-hold circuit 20 operates as though the gain of op amp 15 is much higher than it actually is. The effective gain, from an error standpoint, can be calculated from a charge analysis of circuit 20. Considering time n as clock phase $\Phi_2$, and time n+1 as clock phase $\Phi_1$, the sum of the charges $Q_1$, $Q_2$, $Q_3$ on respective capacitors $C_1$, $C_2$, $C_3$ in clock phase $\Phi_1$ equals the charge $Q_3$ on capacitor $C_3$ in clock phase $\Phi_2$ (capacitors $C_1$, $C_2$ being grounded as shown in FIG. 4b), as follows:

$$Q_1(n+1) + Q_2(n+1) + Q_3(n+1) = Q_3(n) \tag{3}$$

Positive sign polarity is toward the inverting input of op amp 15. Expanding this charge equation according to the voltages and capacitances of the circuit:

$$C_1 V_{in}(n+1) - \frac{V_0(n+1)}{A_0}(C_1 + C_2 + C_3) - V_0(n+1)C_2 = \frac{V_0(n)}{A_0} C_3 \tag{4}$$

In terms of the voltage across capacitor $C_3$ in clock phase $\Phi_1$:

$$V_{C3}(n+1) = \tag{5}$$
$$V_{in}(n+1)\frac{C_1}{A_0 C_2 + C_1 + C_2 + C_3} - V_0(n)\frac{C_3}{A_0(A_0 C_2 + C_1 + C_2 + C_3)}$$

Because the voltage across $C_4$ is, of course, $V_{in}(n+2)$, for the next clock phase $\Phi_2$ can be derived from:

$$V_0(n+2)\left(1 + \frac{1}{A_0}\right) = V_{in}(n+1) + V_{C3}(n+1) \tag{6}$$

which can be expressed as:

$$V_0(n+2) = \frac{A_0}{A_0+1}\left[V_{in}(n+1)\left(1 + \frac{C_1}{A_0 C_2 + C_1 + C_2 + C_3}\right) - V_0(n)\frac{C_3}{A_0(A_0 C_2 + C_1 + C_2 + C_3)}\right] \tag{7}$$

As discussed above, in this example the capacitances $C_1$, $C_2$, $C_3$ are equal. This equation (7) can thus be simplified to:

$$V_0(n+2) = V_{in}(n+1)\frac{A_0}{A_0+1}\frac{A_0+4}{A_0+3} - V_0(n)\frac{A_0}{(A_0+1)(A_0^2+3A_0)} \tag{8}$$

One can compute the finite gain error for a given op amp gain $A_0$ from this equation (8). For example, for a gain $A_0$ of 60 dB, or 1000, the evaluation of equation (8) is:

$$V_0(n+2) = V_{in}(n+1)0.9999970 - V_0(n)9.960129\cdot 10^{-7} \tag{9}$$

For a 60 dB gain op amp utilized in a conventional sample-and-hold circuit, the output voltage $V_0 1 (n+2)$ would be:

$$V_0(n+2) = V_{in}(n+1)\frac{A_0}{A_0+1} = V_{in}(n+1)\cdot 0.999000999 \tag{10}$$

Accordingly, in this example of the preferred embodiment of the invention, sample-and-hold circuit 20 behaves, from the standpoint of finite gain error, as the equivalent of a conventional sample-and-hold circuit in which the op amp has a finite gain $A_0$ of 110 dB, or 334,671. As a result, a lower gain op amp can be used in sample-and-hold circuit 20 according to this embodiment of the invention without loss of precision; conversely, op amp 15 of a higher switching speed (and thus lower gain) can be used to provide higher speed performance without a loss of precision due to the necessarily lower gain of such an op amp. This invention thus provides greater freedom for the designer of circuits utilizing sample-and-hold circuit 20.

Other advantages are also provided by sample-and-hold circuit 20 according to this preferred embodiment of the invention. One such additional advantage is because capacitor $C_3$ also samples low frequency noise, effectively providing a 1/f noise cancellation. In addition, any parasitic capacitance at the output of op amp 15 is precharged during clock phase $\Phi_1$; while op amp 15 must provide a small amount of charge in the transition from clock phase $\Phi_1$ to clock phase $\Phi_2$, the response of the output of op amp 15 is much faster than in conventional circuits. In addition, as will be described in further detail below, output voltage $V_o$ driven by op amp 15 at the end of clock phase $\Phi_1$ is a good approximation of the eventual output voltage $V_o$, and may be fed ahead to later stages in a pipelined circuit utilizing sample-and-hold circuit 20.

Figure 1:
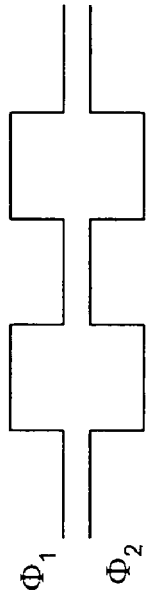
FIG. 1 is an electrical diagram, in schematic form, of a conventional sample-and-hold circuit.
Figure 1:
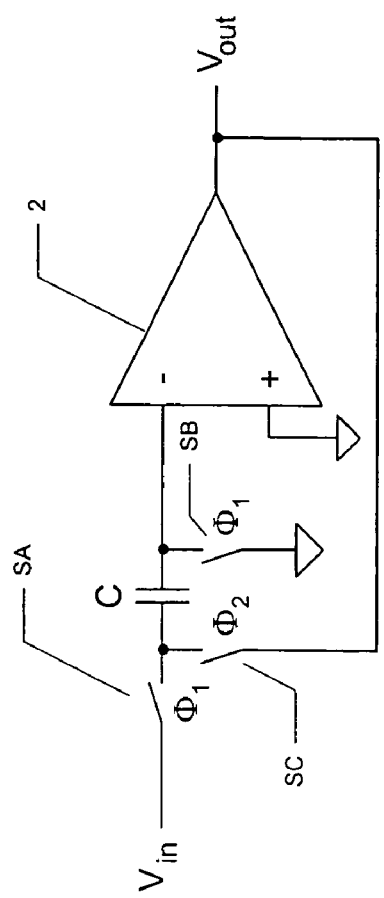
Figure 2:
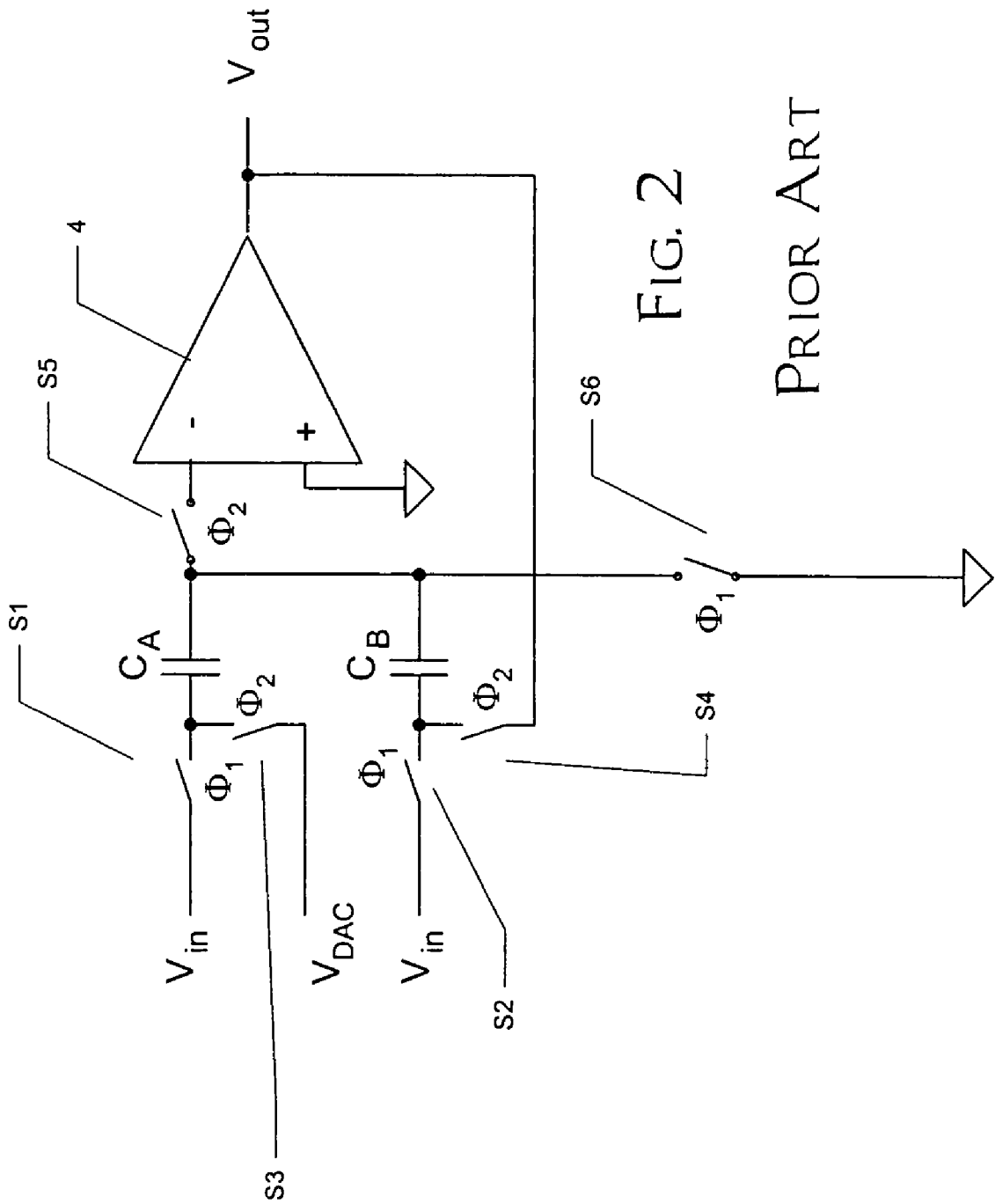
FIG. 2 is an electrical diagram, in schematic form, of a conventional residual gain stage circuit.
Figure 5:
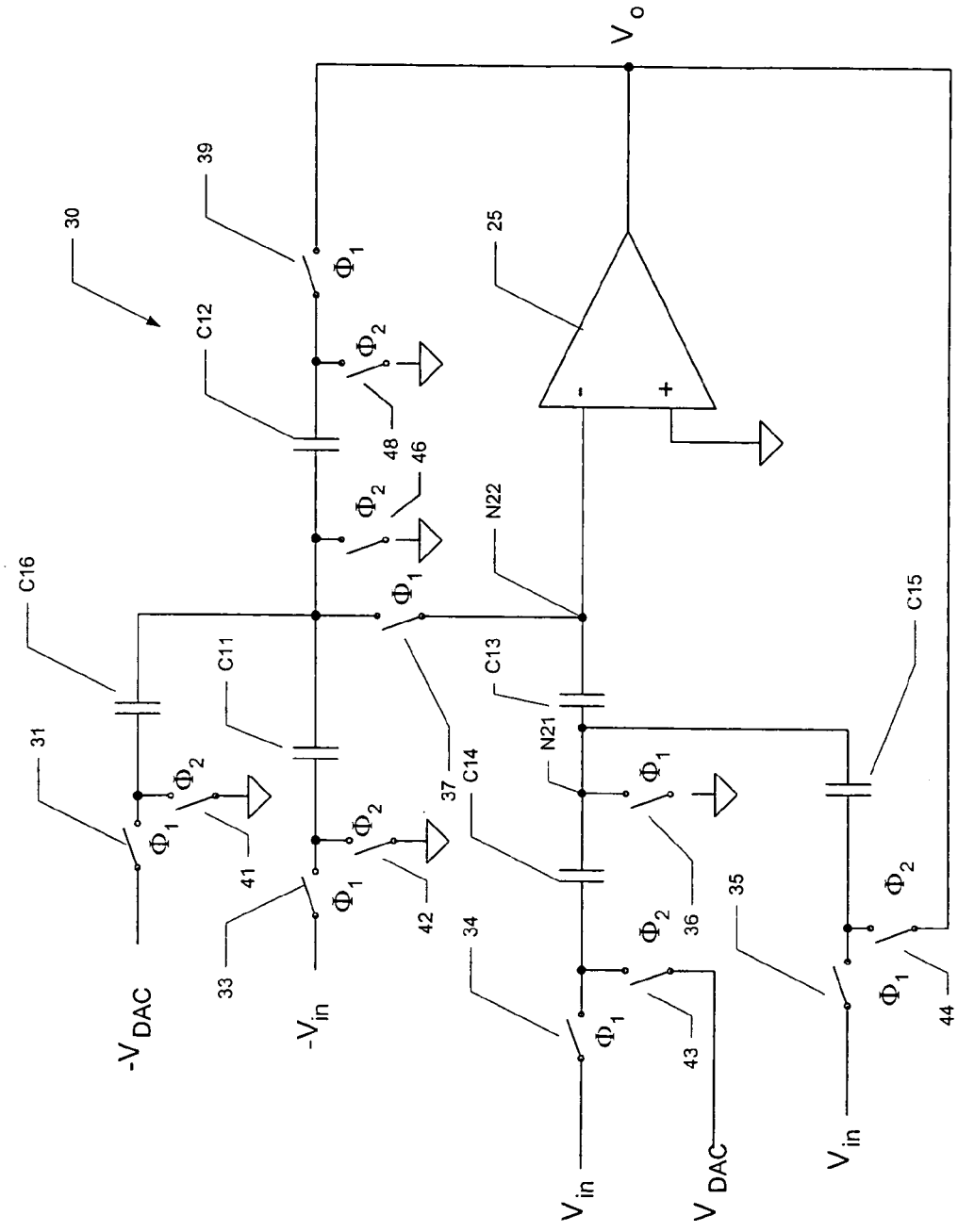
FIG. 5 is an electrical diagram, in schematic form, of a residual gain stage circuit constructed according to the preferred embodiment of the invention.

Other op amp circuits can also take advantage of this invention. FIG. 5 illustrates residual gain generator circuit 30 constructed according to a preferred embodiment of the invention. As discussed above relative to the conventional residual gain generator shown in FIG. 2, residual gain generator circuit 30 of FIG. 5 is for generating an output voltage $V_o$ that is two times the difference between an input voltage $V_{in}$ and a reference voltage $V_{DAC}/2$.

Residual gain generator circuit 30 is based on op amp 25, which has its non-inverting input at ground, and its inverting input connected to node N22. Input voltage $V_{in}$ is applied to one side of capacitor C14 via pass switch 34, and to one side of capacitor C15 via pass switch 35; capacitors C14, C15 are connected to one plate of capacitor C13 at node N21, and the opposite plate of capacitor C13 is connected to the inverting input of op amp 25 at node N22. One feedback loop of op amp 25 is connected to capacitor C15 via pass switch 44. Negative input voltage $-V_{in}$ is applied to capacitor C11 via pass switch 33 at a plate that is selectably grounded by pass switch 42; the opposite plate of capacitor C11 is connected to node N22 via pass switch 37. Another feedback loop from the output of op amp 25 is through capacitor C12 and pass switches 33, 37; pass switches 46, 48 selectably ground both plates of feedback capacitor C12.

The reference voltage $V_{DAC}$ is applied to capacitor C14 via pass switch 43. Conversely, negative reference voltage $-V_{DAC}$ is applied to one plate of capacitor C16 via pass switch 31; this plate is selectably grounded by pass switch 41. The opposite plate of capacitor C16 is connected to capacitor C11, and is also connected to node N22 via pass switch 37.

The construction of pass switches 31 through 39 and 41 through 48 is preferably according to conventional pass gate or pass transistor techniques, for the appropriate manufacturing technology. For example, according to CMOS technology, each of pass switches 31 through 39 and 41 through 48 are preferably parallel-connected p-channel and n-channel MOS transistors, with gates receiving complementary signals. Capacitors C11, C12, C13, C14, C15 are also preferably constructed according to the available integrated circuit manufacturing technology, such as by way of MOS capacitors. The capacitance values of capacitors C11, C12, C13, C14, C15 are selected by the designer according to the desired circuit performance, and according to the gain desired from residual gain generator circuit 30. Typically, capacitors C11 and C16 will have the same capacitance as one another, as will capacitors C14 and C15. It is contemplated that those skilled in the art having reference to this specification will be readily able to select the appropriate capacitance values.

Pass switches 31, 32, 33, 34, 35, 36, 37, 39 are clocked to be closed during clock phase $\Phi_1$ and open otherwise, while pass switches 41, 42, 43, 44, 46, 48 are clocked to be closed during clock phase $\Phi_2$ and open otherwise. As before, clock phases $\Phi_1$ and $\Phi_2$ are non-overlapping clock signals, as conventional for switched-capacitor circuits such as residual gain generator circuit 30.

In operation, residual gain circuit 30 generates an error voltage corresponding to the finite gain error from op amp 25 in the sample phase (clock phase $\Phi_1$), and stores this error voltage across capacitor C13. This error voltage is applied to the inverting input of op amp 25, subtracted from the difference voltage, in clock phase $\Phi_2$, thus compensating for the finite gain error.

Figure 6A:
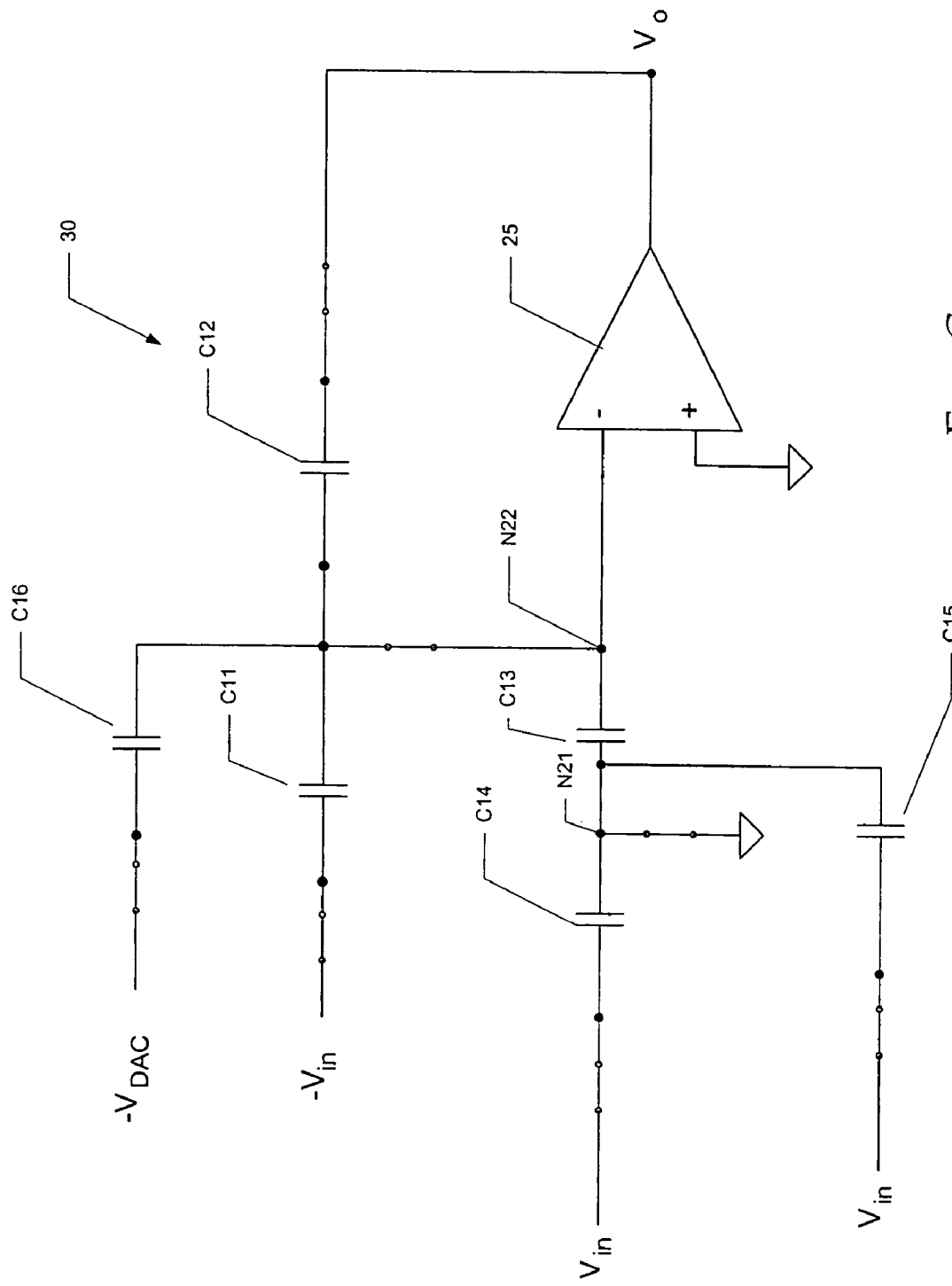
FIGS. 6a and 6b are electrical diagrams, in schematic form, of the residual gain stage circuit of FIG. 5, according to the preferred embodiment of the invention, in first and second clock phases, respectively.

FIG. 6a illustrates residual gain generator circuit 30 during clock phase $\Phi_1$, with none of pass switches 31, 32, 33, 34, 35, 36, 37, 39, 41, 42, 43, 44, 46, 48 shown, for clarity. In clock phase $\Phi_1$, input voltage $V_{in}$ is sampled and stored on capacitor 14, and also on capacitor C15. Also during this clock phase $\Phi_1$, an error voltage is developed across capacitor C13. In the ideal case, the voltage at node N22, at the inverting input of op amp 25, would be at ground (i.e., "virtual" ground) because of the ideal infinite gain of op amp 25, and the voltage across capacitor C13 would be zero (because node N21 is also at ground). But because op amp 25 has a finite gain $A_0$, the voltage at node N22 is not at zero, but is instead at a voltage $$\frac{V_o}{A_0}.$$

Figure 6B:
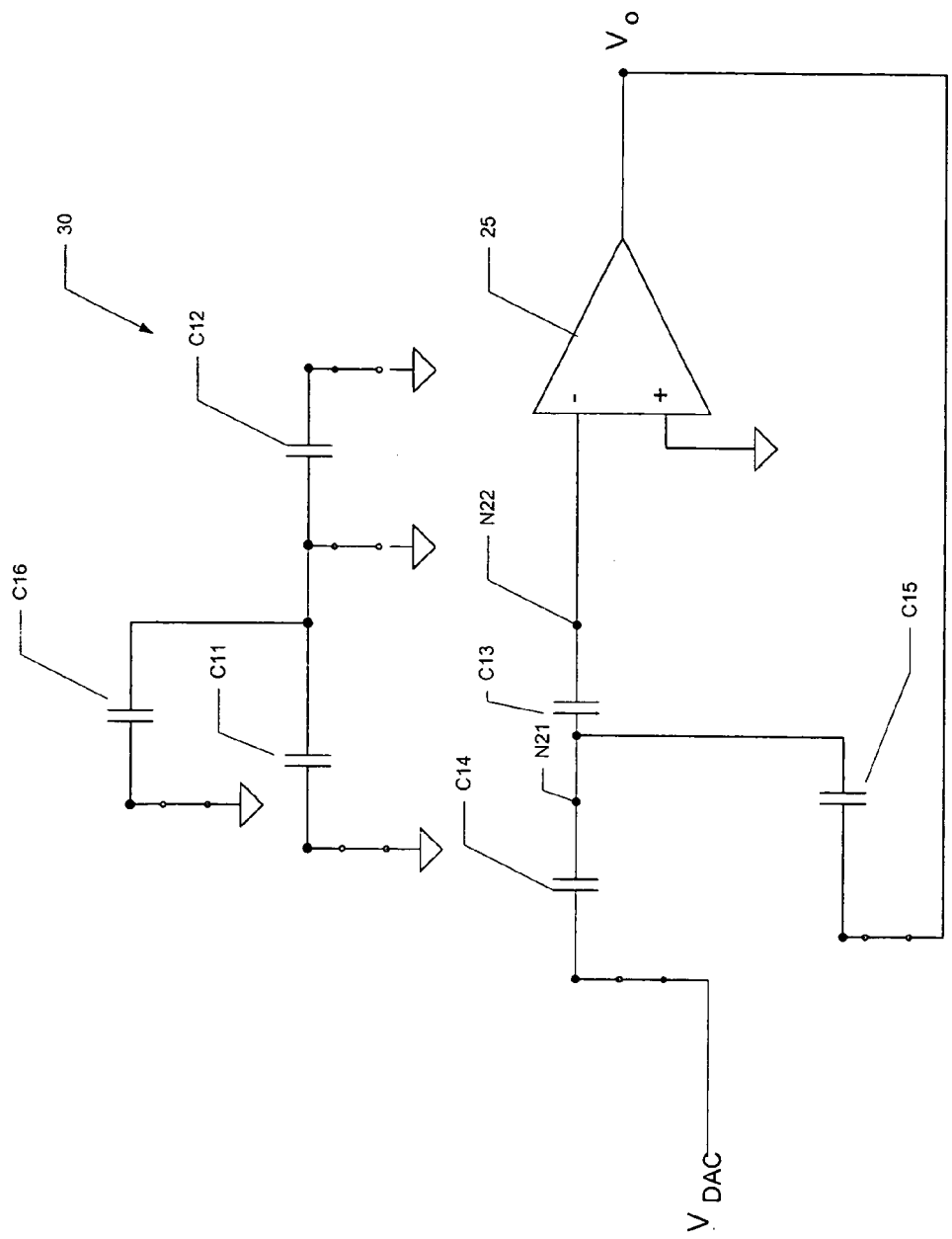

The application of negative reference voltage $-V_{DAC}$ to capacitor C16, negative input voltage $-V_{in}$ to capacitor C11, and input voltage $V_{in}$, to capacitor C15, along with the connection of capacitor C12 in the feedback loop, effectively produces the same input condition to op amp 25 as in normal operation, as will become evident from the following description of the operation of residual gain generator circuit 30 during clock phase $\Phi_2$, as shown in FIG. 6b. The error voltage $$\frac{V_o}{A_0}$$

is stored across capacitor C13, in clock phase $\Phi_1$.

In clock phase $\Phi_2$, pass switches 41, 42, 43, 44, 46, 48 are closed and pass switches 31, 32, 33, 34, 35, 36, 37, 39 are open. The resulting circuit arrangement during clock phase $\Phi_2$ is shown in FIG. 6b. Capacitors C11, C16, C12 are all discharged to ground. The feedback path from the output of op amp 25 is connected through capacitor C15, which received input voltage $V_{in}$ in clock phase $\Phi_1$; reference voltage $V_{DAC}$ is applied to capacitor C14, which also receive input voltage $V_{in}$ in clock phase $\Phi_1$. Accordingly, the voltage at node N21 in clock phase $\Phi_2$ is a difference voltage that is developed in similar fashion as equation (1), namely as twice the input voltage $V_{in}$ less the reference voltage $V_{DAC}$. The error voltage $$\frac{V_o}{A_0}$$

stored across capacitor C13 in clock phase $\Phi_1$ is effectively subtracted from this difference voltage by the series connection of capacitor C13 between nodes N21 and N22, thus correcting for the finite gain error of op amp 25.

According to this embodiment of the invention, the finite gain correction applied in residual gain generator circuit 30 has improved accuracy over conventional circuits, because the same input voltage $V_{in}$ that is sampled in the sample clock phase $\Phi_1$ is used (in the form of the negative input voltage $-V_{in}$) in generating the correction error voltage at capacitor 13. The residual gain output voltage $V_o$ is therefore quite accurate.

This accuracy depends upon a stable reference voltage $V_{DAC}$ over both clock phases $\Phi_1$ and $\Phi_2$. In some high-speed applications, this assumption may not be exactly accurate. For example, in a conventional ADC circuit, the reference voltage $V_{DAC}$ is an output voltage resulting from a digitized version of the input voltage $V_{in}$ itself. This digitized input may not be ready at the time that the input voltage $V_{in}$ is sampled. One could wait for an additional cycle of the sample and hold clocks, but this would insert latency into the system. According to a preferred embodiment of the invention, as implemented into a pipelined ADC, an estimate of the reference voltage $V_{DAC}$ is sampled by residual gain generator 30; while this estimate may not be completely accurate, it is contemplated that other circuitry can be used to minimize the error resulting from the feeding-ahead of the reference voltage $V_{DAC}$, as will now be described with reference to FIG. 7.

Figure 7:
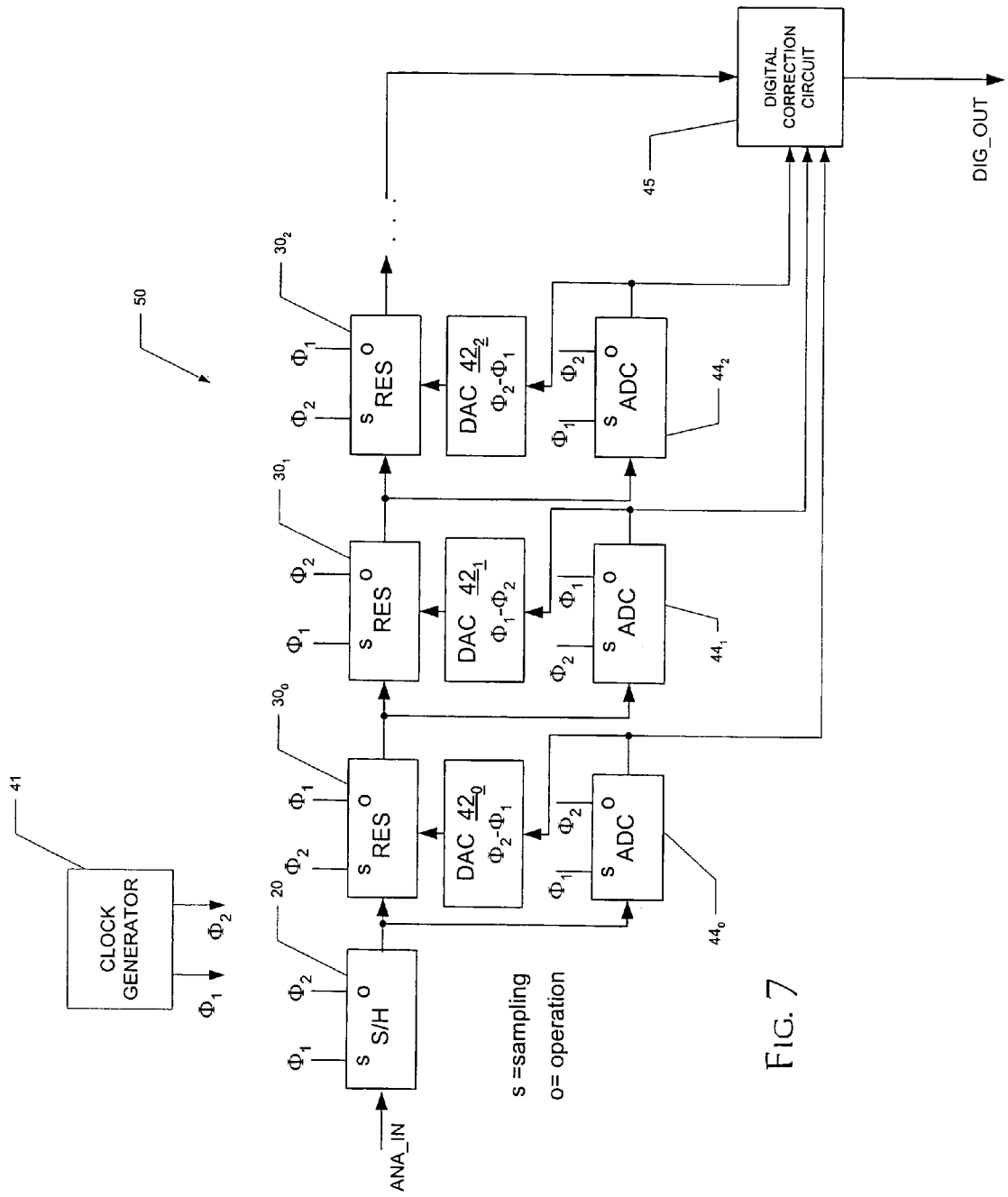
FIG. 7 is an electrical diagram, in block form, of a pipelined ADC constructed according to the preferred embodiment of the invention.

Pipelined ADC 50 may be implemented into a stand-alone integrated circuit, or alternatively may be implemented into an integrated circuit that also includes other functions. For example, pipelined ADC 50 may be implemented into a single-chip system for processing signals, such as a single-chip mobile telephone handset device or the like. In any event, conventional control, power, and clock circuitry (not shown in FIG. 7) will be provided in the integrated circuit into which pipelined ADC 50, to provide the appropriate control functions, power supply and reference voltages, and system clock signals for pipelined ADC 50 and the other functions in the integrated circuit. According to this preferred embodiment of the invention, as shown in FIG. 7, clock circuit 41 generates non-overlapping clock phases $\Phi_1$ and $\Phi_2$, which control pipelined ADC 50 as will be described below.

Pipelined ADC 50 according to this preferred embodiment of the invention includes sample-and-hold circuit 20, which receives an input analog signal ANA_IN. Sample-and-hold circuit 20 is preferably constructed according to the preferred embodiment of this invention described above relative to FIG. 3, and as such samples the state of input analog signal ANA_IN and provides a held analog level corresponding to the sampled signal at its output. Sample-and-hold circuit 20 operates in response to clock phases $\Phi_1$ and $\Phi_2$, with clock phase clock $\Phi_1$ corresponding to the sample phase, and clock phase $\Phi_2$ corresponding to the operation, or "hold", phase. The output of sample-and-hold circuit 20 is applied to a first one of a sequence of multiple pipeline stages, each stage including a residual gain generator 30, an analog-to-digital converter (ADC) 44, and a digital-to-analog converter (DAC) 42. Pipeline stages of this construction are typically referred to as multiplying digital-to-analog converter (MDAC) stages. In FIG. 7, three such stages are specifically shown; the other stages following the first three are implied.

In the first pipeline stage, residual gain generator $30_0$ and first analog-to-digital converter (ADC) $44_0$ receive the output of sample-and-hold circuit 20. Residual gain generator $30_0$, as well as residual gain generators $30_1$, $30_2$, etc. in the later pipeline stages, are preferably constructed according to the preferred embodiment of the invention, as described above relative to FIG. 5. As such, the output of sample-and-hold hold circuit 20 is received as input voltage $V_{in}$ (and its complement, negative input voltage $-V_{in}$) to residual gain generator circuit $30_0$. According to the preferred embodiment of the invention, the clock phasing of residual gain generator circuit $30_0$ is opposite from that of sample-and-hold circuit 20, in that clock phase $\Phi_2$ is the sample clock phase for gain generator circuit $30_0$ (corresponding to clock phase $\Phi_1$ in the description relative to FIGS. 5 and 6a), and clock phase $\Phi_1$ is the operating clock phase for gain generator circuit $30_0$ (corresponding to clock phase $\Phi_2$ in the description relative to FIGS. 5 and 6b). This reversal of the clock phases provides excellent performance, as will be described in further detail below.

According to the preferred embodiment of the invention, ADC $44_0$ is preferably a conventional 1.5 bit analog-to-digital converter circuit, or threshold comparator, as known in the art. As such, ADC $44_0$ compares the analog signal at its input (from sample-and-hold circuit 20, in this example) to a positive threshold V+ and a negative threshold V−, and generates a two bit digital value at its output in response to this comparison. For example, the output state 00 may indicate that the input voltage is lower than both of the thresholds V+ and V−, the state 01 may indicate that the input voltage is higher than negative threshold V− but lower than positive threshold V+, and the state 11 may indicate that the input voltage is higher than both of the thresholds V+ and V−. In this first stage, ADC $44_0$ samples the input voltage in clock phase $\Phi_1$ and performs the comparison and outputs the digital value in clock phase $\Phi_2$. This digital output from ADC $44_0$ is applied to the input of digital-to-analog converter (DAC) stage $42_0$, as shown in FIG. 7. In addition, the digital value output by ADC $44_0$ corresponds to a bit of the digital result (namely the most significant bit, for first stage ADC $44_0$), and is applied to digital correction circuit 45.

DAC stage $42_0$ in this first pipeline stage is a conventional 1.5 bit DAC, in that it generates an analog level responsive to the digital level received at its input. In DAC stage $42_0$ of this first stage of ADC circuit 50, clock phase $\Phi_2$ is the sample clock phase and clock phase $\Phi_1$ is the operating clock phase. Accordingly, the digital output of ADC $44_0$ is latched in clock phase $\Phi_2$ and the output level is generated in clock phase $\Phi_1$, in this first pipeline stage. According to this embodiment of the invention, the output signal from DAC stage $42_0$ is reference voltage $V_{DAC}$, and preferably also its complement, negative input voltage $-V_{DAC}$.

The output reference voltages $V_{DAC}$, $-V_{DAC}$ generated by DAC stage $42_0$ are received by residual gain generator $30_0$, along with the input voltages $V_{in}$, $-V_{in}$ from sample-and-hold circuit 20, as mentioned above. In this first pipeline stage, according to this preferred embodiment of the invention and as mentioned above, clock phase $\Phi_2$ is the sample clock phase for residual gain generator circuit $30_0$, and clock phase $\Phi_1$ is the operating clock phase. Accordingly, the input voltage $V_{in}$ from sample-and-hold circuit 20 is sampled, and the error voltage across capacitor C13 (FIG. 5) is developed from negative input voltage $-V_{in}$ and negative reference voltage $-V_{DAC}$ during clock phase $\Phi_2$. The output voltage $V_o$, corresponding to the residual between input voltage $V_{in}$ and reference voltage $V_{DAC}$ from DAC $42_0$ is then generated in clock phase $\Phi_1$, and applied as the input voltage $V_{in}$ to residual gain generator circuit $30_1$ and ADC $44_1$ in the second pipeline stage.

The residual output from residual gain generator circuit $30_0$ corresponds to the residual remainder between the original input voltage ANA_IN, once the most significant bit is extracted (by ADC $44_0$). In this embodiment of the invention, this residual value is then again compared to a threshold value by ADC $44_1$ to generate the next most significant bit of the converted digital output signal, and the residual is forwarded to the next pipeline stage for extraction of the next most significant bit, and so on. The final residual output from a last pipeline stage of ADC 50 is applied to digital correction circuit, along with the digital bit values from each of ADC's 44 in the pipeline stages, to generate the digital output value DIG_OUT.

Figure 8:
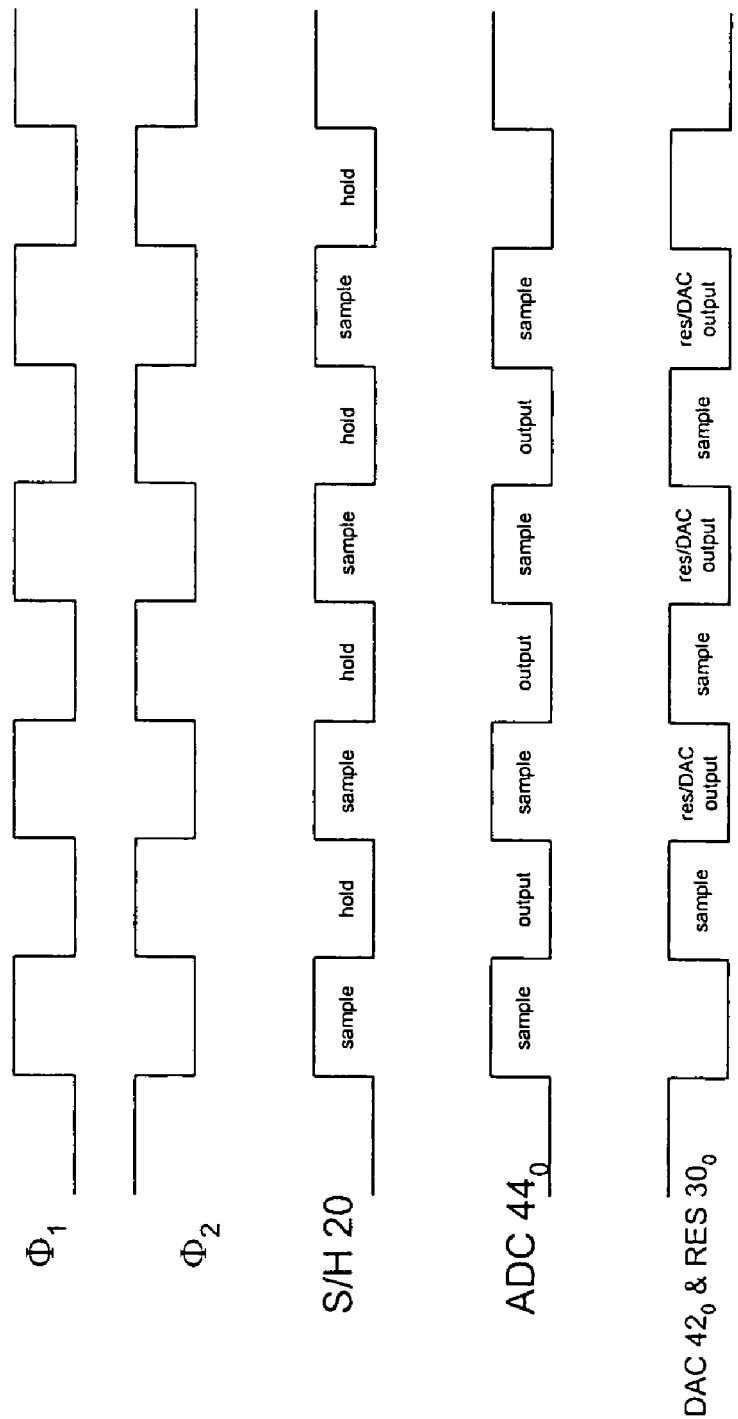
FIG. 8 is a timing diagram illustrated the phased operation of the pipelined ADC of FIG. 7, according to the preferred embodiment of the invention.

As mentioned above, sample-and-hold circuit 20 of ADC 50 samples the input signal ANA_IN during clock phase clock $\Phi_1$, and outputs input voltage $V_{in}$ to the first residual gain generator circuit $30_0$ during clock phase $\Phi_2$. This operation is illustrated in FIG. 8. As described above relative to FIG. 3, however, the output of sample-and-hold circuit 20 during its sample clock phase $\Phi_1$ is a reasonably good approximation of the eventual output voltage (without the finite gain error correction from capacitor $C_3$, but from which this finite gain error is determined). Because of its 1.5 bit construction, some amount of error in the input voltage applied to ADC $44_0$ can be tolerated. In ADC 50 according to this embodiment of the invention, therefore, ADC $44_0$ samples the output of sample-and-hold circuit 20 in the same clock phase $\Phi_1$ as the sample phase of sample-and-hold circuit 20 itself.

In the next clock phase, namely clock phase $\Phi_2$, sample-and-hold circuit 20 presents its precise output voltage, and ADC $44_0$ presents a digital value corresponding to the comparison of the voltage that it sampled in the previous clock phase $\Phi_1$ to the threshold V+, V−. DAC $42_0$ samples this estimated voltage and generates its corresponding analog output voltage $V_{DAC}$ (and negative reference voltage $-V_{DAC}$) to residual gain generator $30_0$, for sampling during clock phase $\Phi_2$. Also during this clock phase $\Phi_2$, residual gain generator $30_0$ samples the input voltage $V_{in}$ (and negative input voltage $-V_{in}$). In the next clock phase $\Phi_1$, residual gain generator $30_0$ in the first pipeline stage of pipelined ADC 50 generates its output voltage $V_o$, which is applied to residual gain generator $30_1$ as the true residual voltage. Residual gain generator $30_1$ samples this voltage during this clock phase $\Phi_1$.

As described above relative to FIGS. 5 and 6a, residual gain generator $30_0$ generates an output voltage $V_o$ during its sample phase (clock phase $\Phi_2$) that is a reasonable approximation of the eventual output voltage $V_o$; this approximation is used to derive the finite gain error voltage that is stored across its capacitor C13. According to this preferred embodiment of the invention, ADC $44_1$ in the second pipeline stage of pipelined ADC 50 samples this approximated output voltage $V_o$ during this same clock phase $\Phi_2$. Similarly as in the operation of ADC $44_0$, which generates its result from an approximation of the output of sample-and-hold circuit 20, ADC $44_1$ utilizes this approximate output voltage from residual gain generator $30_0$ for its operations. This ensures that good approximation of voltage $V_{DAC}$ is present at residual gain generator $30_1$ in this second pipeline stage at the next clock phase $\Phi_1$, at which the time true residual voltage from residual gain generator $30_0$ is present.

As evident from FIG. 7, the phased operation of each of the pipeline stages alternates from stage to stage. In this example, each ADC stage 44 in the first and third stages (and all subsequent odd-numbered stages) samples its input in clock phase $\Phi_1$ and performs the comparison and outputs a digital value in clock phase $\Phi_2$. Conversely, each ADC stage 44 in the second stage (and all subsequent even-numbered stages) samples its input in clock phase $\Phi_2$ and performs the comparison and output in clock phase $\Phi_1$. Each residual gain generator circuit 30 in the first and third stages (and all subsequent odd-numbered stages) samples its inputs and generates an approximate output voltage in clock phase $\Phi_2$ and generates the accurate output residual voltage in clock phase $\Phi_1$, while each residual gain generator circuit 30 in the second (and all subsequent even-numbered stages) samples its inputs and generates an approximate output voltage in clock phase $\Phi_1$ and generates the accurate output residual voltage in clock phase $\Phi_2$. This alternating clock phasing ensures minimum latency through pipelined ADC 50.

This operation of pipelined ADC 50 continues through each of the pipelined stages. Following the last pipelined stage, the output of the last residual gain generator is applied to digital correction circuit 45, along with the digital values from each of the ADC stages 44. Digital correction circuit 45 is a conventional circuit as commonly known in the art for applying comparator digital correction in an ADC. Because the values generated by DAC stages 42 are not from the actual sampled value of the preceding stage but rather from the predictive values, these values may contain a error. However, because this error is not intrinsically caused by the DAC stage 42 but rather by the input presented to the comparators in its pipeline stage, that error can be referred to the input of the comparators (ADC stages 44) and will be corrected by circuit 45 in the conventional manner. Digital error correction circuit 45 operates by time aligning and summing the outputs of ADC stages 44. As known in the art, if the digital output from any one of a more significant pipeline stage is in error, the resulting residue that is passed to less significant pipeline stages (assuming no over-ranging of these later stages) will produce a digital output code from the less significant pipeline stages that, when added to the erroneous more significant digital output by digital error correction circuit 45, will still produce the correct overall digital output from ADC 50. A description of the operation of a conventional digital error correction circuit 45 is provided in "Understanding Pipelined ADCs", Application Note 383 (Dallas Semiconductor, Mar. 1, 2001), available at http://www.maxim-ic.com/appnotes.cfm/appnote_number/ 383. It is contemplated that as many as ten or more such pipeline stages will often be implemented, but of course the number of such pipeline stages will depend upon the desired precision of the digital output signal DIG_OUT.

According to the preferred embodiments of the invention, therefore, the effects of finite op amp gain are greatly eliminated from switched-capacitor circuits, such as the sample-and-hold and residual gain generator circuits described above. In effect, the precision of these circuits resembles that of circuits having op amps with much higher open loop gain values. Considering the well-known tradeoff between switching speed and open loop op amp gain, this invention permits higher switching speed op amps to be used in these switched-capacitor circuits, without the expected cost in precision or increased error that would otherwise result from faster, but lower gain, op amps.

In addition, this invention provides a highly efficient pipelined analog-to-digital converter, in which estimates of previous voltage levels, from sample phases, are used in downstream residual gain generator circuits, greatly reducing the latency of each pipelined stage. To the extent that these estimates result in error in the output, it is contemplated that conventional digital correction can account for such error.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A switched-capacitor operational amplifier circuit, comprising:
    an operational amplifier, having an input and an output;
    a first sampling capacitor;
    an error capacitor, connected to the first sampling capacitor at a first node, and connected to the input of the operational amplifier;
    a second sampling capacitor;
    a feedback capacitor, connected to the second sampling capacitor at a second node;
    a grounding switch for connecting the first node to a ground potential responsive to a first clock phase;
    first and second sampling switches, for connecting the first and second sampling capacitors to complementary input voltages responsive to the first clock phase;
    sampling feedback switches, for connecting the feedback capacitor between the input and output of the operational amplifier through the second node responsive to the first clock phase;
    a feedback switch, for connecting the output of the operational amplifier to the first sampling capacitor responsive to a second clock phase; and
    grounding switches, for connecting the feedback capacitor to ground potential responsive to the second clock phase.

2. The circuit of claim 1, further comprising:
    a discharge switch, for connecting the second sampling capacitor to ground potential responsive to the second clock phase.

3. The circuit of claim 1, further comprising:
    a first difference network, coupled to the first node, and comprising:
    a third sampling capacitor, connected to the first node;
    a third sampling switch, for connecting the third sampling capacitor to an input voltage responsive to the first clock phase;
    a fourth sampling switch, for connecting the third sampling capacitor to a reference voltage responsive to the second clock phase; and
    a second difference network, comprising:
    a fourth sampling capacitor, connected to the second node;
    a fifth sampling switch, for connecting the fourth sampling capacitor to a negative reference voltage responsive to the first clock phase;
    a discharge switch, for connecting the fourth sampling capacitor to ground responsive to the second clock phase.

4. The circuit of claim 1, wherein the operational amplifier has an inverting input and a non-inverting input;
    wherein the non-inverting input is connected to ground potential; and
    wherein the inverting input is connected to the error capacitor.

5. A method of operating an operational amplifier circuit, comprising:
    in a first clock phase, storing an input voltage on a first sampling capacitor, and applying a negative of the input voltage to a second capacitor;
    in the first clock phase, operating an operational amplifier to generate an approximate output voltage responsive to the negative of the input voltage at the second capacitor;

in the first clock phase, storing an error voltage at an input of the operational amplifier on an error capacitor, the error voltage corresponding to a voltage above ground potential at the input of the operational amplifier;

in a second clock phase, connecting the first sampling capacitor in series with the error capacitor to the input of the operational amplifier and operating the operational amplifier.

6. The method of claim 5, wherein the step of operating the operational amplifier in the first clock phase comprises:

connecting the second capacitor to the input of an operational amplifier; and connecting an output of the operational amplifier through a feedback capacitor to the input of the operational amplifier.

7. The method of claim 6, wherein the step of storing an error voltage comprises:

connecting an error capacitor between the input of the operational amplifier and a ground potential.

8. The method of claim 5, further comprising:

in the first clock phase, applying a negative reference voltage to a third capacitor connected to the input of the operational amplifier;

in the second clock phase, connecting a reference voltage to a fourth capacitor in series with the error capacitor to the input of the operational amplifier.

* * * * *